United States Patent [19]

Richart et al.

[11] Patent Number: 5,427,963
[45] Date of Patent: Jun. 27, 1995

[54] METHOD OF MAKING A MOS DEVICE WITH DRAIN SIDE CHANNEL IMPLANT

[75] Inventors: Robert B. Richart; Shyam G. Garg; Bradley T. Moore, Jr., all of Austin, Tex.

[73] Assignee: Advanced Micro Devices, Inc., Sunnyvale, Calif.

[21] Appl. No.: 165,112

[22] Filed: Dec. 10, 1993

[51] Int. Cl.$^6$ .......................................... H01L 21/266
[52] U.S. Cl. ...................................... 437/41; 437/43; 437/984
[58] Field of Search ...................... 437/29, 30, 41, 43, 437/49, 962, 984; 148/DIG. 106

[56] References Cited

U.S. PATENT DOCUMENTS

| | | | |
|---|---|---|---|
| 4,999,812 | 3/1991 | Amin | 365/185 |
| 5,070,032 | 12/1991 | Yuan et al. | 437/43 |
| 5,100,818 | 3/1992 | Arima et al. | 437/43 |
| 5,101,250 | 3/1992 | Arima et al. | 357/23.5 |
| 5,120,671 | 6/1992 | Tang et al. | 437/984 |
| 5,304,505 | 4/1994 | Hazani | 437/43 |
| 5,316,961 | 5/1994 | Okazawa | 437/43 |

OTHER PUBLICATIONS

K. Robinson, "Endurance Brightens the Future of Flash—Flash Memory as a Viable Mask-Storage Alternative", *Electronic Component News*, (Nov., 1988), pp. 167-169.
S. Lai et al., "Comparison and Trends in Today's Dominant E$^2$ Technologies", *Int'l Electron Devices Meeting Tech. Digest*, pp. 580-583 (1986).
B. J. Woo et al., "A Novel Memory Cell Using Flash Array Contactless EPROM (FACE) Technology", *IEDM*, pp. 91-94 (1990).
O. Bellezza et al., "A New Self-Aligned Field Oxide Cell for Multimegabit EPROMs", *IEDM*, pp. 579-582 (1989).
Yosiaki S. Hisamune et al., "A 3.6 $\mu m^2$ Memory Cell Structure for 16MB EPROMs", pp. 583-586 (1989).

*Primary Examiner*—Brian E. Hearn
*Assistant Examiner*—Chandra Chaudhari
*Attorney, Agent, or Firm*—Conley, Rose & Tayon

[57] ABSTRACT

An MOS device is provided having a drain- or source-side implant into the channel region in order to minimize short-channel effects. Implant into the channel region is achieved using conventional processing techniques, wherein the channel implant is directed substantially perpendicular to the upper surface of the substrate. Numerous masking steps and reorientation of the substrate is not needed. Additionally, the drain- or source-side implant mask can be formed from currently existing masks and incorporated into a standard processing flow for either a standard MOS device or a memory array comprising dual-level polysilicon. If drain-side implant is chosen, then the lateral demarcation line between the drain implant and the substrate is preferably placed within the channel region, and preferably near a mid-point within the channel a spaced distance below a subsequently placed, overlying polysilicon.

20 Claims, 3 Drawing Sheets

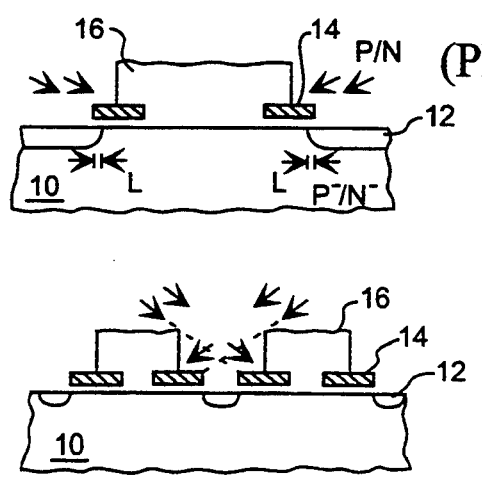
FIG. 14 (PRIOR ART)
FIG. 15 (PRIOR ART)
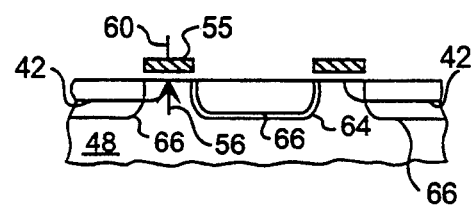
FIG. 16
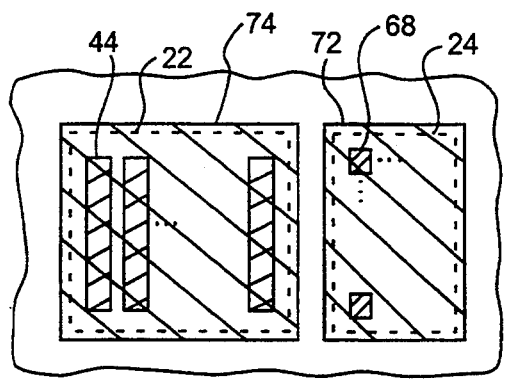
FIG. 17
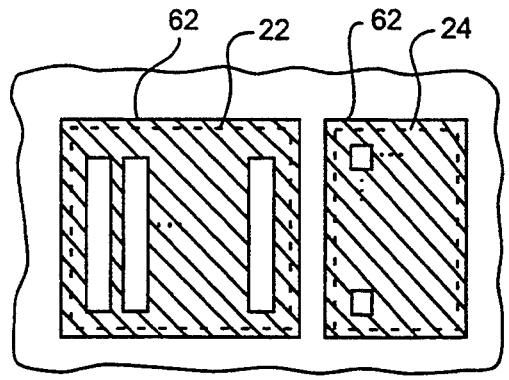
FIG. 18

METHOD OF MAKING A MOS DEVICE WITH DRAIN SIDE CHANNEL IMPLANT

BACKGROUND OF THE INVENTION

1. Field of the Invention

This invention relates to metal oxide semiconductor (MOS) fabrication and more particularly to an improved method for manufacturing an MOS device having drain-side implant regions which extend into the channel area.

2. Background of the Relevant Art

Recent advances in semiconductor fabrication have made possible ultra large scale integrated (ULSI) circuits with dense layout topography. As circuits become more dense, critical dimensions of the polysilicon gate area become extremely small. In many instances, circuits have been manufactured having gate lengths less than one micron, and in some instances less than one half micron.

It is important that critical dimensions be reduced in order for the monolithic circuit to accommodate as many active and passive devices as possible. It is also important to control the deleterious effects often associated with smaller critical dimensions. Smaller critical dimensions generally bring about what is often called "short channel effects". For example, as the channel length decreases a greater opportunity arises for electric field charge to invert the short channel area. As such, the effects of a shorter channel may cause significant reduction the MOS device's threshold voltage. Secondly, because of the short channel (i.e., close proximately between the source and drain region), some channel leakage might arise during times in which the transistor should be completely off. While all transistors demonstrate some form of leakage, subthreshold leakage associated with a short channel transistor can be quite large and lead to severe power drains upon the circuit power supply. Thirdly, the drain region may "punch through" to the closely spaced source region when relatively small voltages are placed upon the drain, relative to the source and substrate. The punch through phenomena, often referred to as "breakdown voltage" (BVDSS), is well documented and is particularly acute in short channel length transistors. The above problems are only a few of many problems associated with short channel effects, all of which are well known to the skilled artisan.

In an effort to overcome short channel effects, many researchers and semiconductor manufactures utilize a well known technique, called "large-angle implants". Large-angle implant (LAI) reduces or inhibits charge mobility between the source and drain regions and within the channel by implanting an impurity region partially within the channel of opposite impurity type than that of the source or drain. LAI requires the impurity species be directed at a non-perpendicular angle of approximately 45° relative to the substrate upper surface. LAI occurs after the polysilicon is deposited and patterned, as shown in FIG. 14. LAI implant, of opposite impurity than source or drain regions 12 (i.e., the same impurity type as the substrate), can penetrate into substrate 10 a lateral distance, L, inside the outer edge of polysilicon 14.

LAI technique can perform channel implant from either the drain side, the source side, or both sides of an active MOS device. As shown in FIG. 14, LAI implant can occur from, e.g., only the drain-side provided the source side is masked off by photoresist 16. Placement of photoresist and selectively removing the portions of photoresist within the active area requires an additional masking step. Still further, LAI, due to its non-perpendicular orientation, requires a special implanter be placed at a unique angle relative to the substrate. Moreover, the substrate or implanter must be re-oriented each time a set of drains (or sources) 12 are to be implanted underneath a portion of polysilicon 14. As shown in FIG. 14, if drain-side implants are needed, the wafer must be re-oriented in relation to the implanter in order to implant both drain areas as shown. It may be necessary, in many instances, to re-orient the wafer at four different position in order to achieve all four possibilities of drain-side implant locations.

As shown in FIG. 15, a further problem associated with LAI techniques is demonstrated whenever the critical dimensions become extremely small. As critical dimensions become less than a specified amount (e.g., 0.5 microns), the angle of implantation may not allow implant underneath polysilicon 14 given the geometries of the overlying photoresist 16. Photoresist 16 over the source of one device may absorb the impurity species meant for placement within an adjacent device's drain.

The problems described above and shown in FIGS. 14 and 15 arise in all LAI techniques. Additional masking steps and patterned photoresist are necessary when implanting on only the source-side of the channel. Even if implanting in both the source and drain-sides is allowed, additional masking steps are nonetheless needed in order to block off or mask the N-channel devices from the P-channel devices in CMOS fabrication. Thus, masking steps and associated alignment problems as well as implanter or substrate re-orientation problems lessens the advantages of LAI in overcoming short channel problems described above.

SUMMARY OF THE INVENTION

The problems outlined above are in large part solved by the improved drain- or source-side channel implant technique of the present invention. That is, the channel implant process hereof achieves the advantages of placing impurities into the channel regions which are of opposite type than those within the source and drain regions in order to counteract short channel effects. The present process does not implant at a non-perpendicular angle and, therefore, avoids the problems of photomasking, lithography alignment and implanter-substrate re-orientation. Even still further, the present process is well adapted to fine line geometries and circuits with critical dimensions as small as 0.5 microns and, in many instances, less than 0.5 microns. Yet further, the present process falls within the standard photolithography methodology, utilizing pre-existing masks at a perpendicular implantation angle upon the substrate. The present process is well suited for drain-side implant into the channel region whenever electrically programmable transistors, such as EPROM, flash EPROM or EEPROM-type transistors are used. Still further, source, drain or source and drain-side implants can be achieved for a standard PMOS or NMOS FET device. As such, the present process can be used in forming any short channel device in any memory array area or logic area having MOS devices.

Broadly speaking, the present invention contemplates a method of manufacturing a MOS device comprising the steps of providing a substrate having a first type impurity placed therein. A drain region also having a first type impurity can then be implanted into the substrate, wherein the drain region is laterally bounded by a demarcation line. The demarcation line separates measurable amounts of impurities within the drain area from those within the substrate. A polysilicon strip can then be placed upon the substrate. The strip extends substantially parallel with and above a select portion of the demarcation line. A second type of impurity can then be implanted at a greater dose into the source and drain regions than the dosage placed within only the drain region. The source and drain regions are implanted on the opposite sides of the polysilicon strip according to self-aligned techniques.

The polysilicon strip is placed by blanket depositing a layer of polysilicon and then removing select portions of the layer to form the strips. Each strip comprises a width defined between a pair of elongated edges. An alignment line extends along the strip parallel to the edges such that the alignment line is in alignment with and in direct perpendicular distance above the select portion of the demarcation line. The alignment line is preferably at a midway point between the edges such that the width of the polysilicon is spaced directly over the demarcation line.

The drain region is implanted by depositing photoresist upon the substrate and then placing a drain implant mask above the photoresist. The photoresist is then polymerized in accordance with the pattern upon the drain implant mask, and the non-polymerized photoresist is removed in order to allow ion bombardment into the exposed substrate void of photoresist. The source/drain implanting step comprises the steps of depositing photoresist upon the substrate and placing a source implant mask above the photoresist in order to polymerize select portions of the photoresist in order for non-polymerized portions to be removed. Select source regions void of photoresist can then receive ion bombardment. The remaining photoresist can then be removed to allow ion bombardment in all active regions upon the substrate (e.g., in both the source and drain regions). Thus, the source/drain implanting step requires implanting into the source region at a light dose prior to implanting into both the source and drain regions at a heavier dose. Importantly, the drain implant mask can be easily and conveniently formed by reversing the source implant mask at select portions. The drain implant mask is thereby formed from the source implant mask—a mask which is normally used in a conventional self-aligned source technique.

A second polysilicon strip can be placed a spaced distance above the first polysilicon strip prior to the source/drain implanting step in order to form an electrically programmable transistor. A metalization layer can be added with contacts to the drain region in order to form a bit line within an array of memory cells. As such, an additional polysilicon strip and bit line is well suited for memory array configuration; however, non-memory application can also be achieved.

BRIEF DESCRIPTION OF THE DRAWINGS

Other objects and advantages of the invention will become apparent upon reading the following detailed description and upon reference to accompanying drawings in which:

FIG. 14 is a cross-sectional view of a drain- or source-side implant according to a conventional large angle implant technology;

FIG. 15 is a cross-sectional view of a drain- or source-side implant at small critical dimensions according to a conventional large angle implant technology;

FIG. 16 is a cross-sectional view of a drain- or source-side implant within a MOS device according to the present invention;

FIG. 17 is a top plan view of FIG. 1 with source implant masking regions and threshold adjust masking regions shown according to the present invention;

FIG. 18 is a top plan view of FIG. 1 with drain implant masking regions formed by a combination of inverse source masking regions and threshold adjust regions shown thereon according to the present invention.

Figure 1:
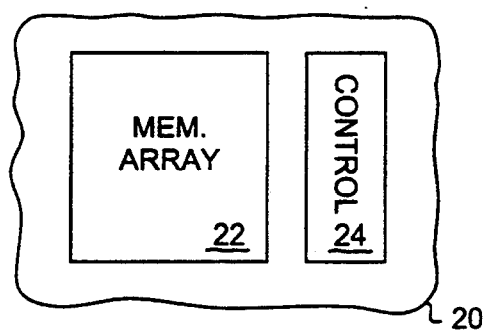
FIG. 1 is a top plan view of a semiconductor die embodying a memory array and control circuitry according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a top plan view of a semiconductor die 20 with MOS devices formed according to the present invention. MOS devices can be patterned in an array and placed within memory block 22 and/or formed within a logic control block 24. If MOS devices are formed within array 22, they can comprise electrically programmable transistors such as EEPROMs, EPROMs or flash EPROMs. Program and erase features of EPROMs can be achieved using well known technologies such as: (i) floating gate tunnel oxide, (ii) textured poly, (iii) metal nitrate oxide silicon (MNOS), and (iv) EPROM tunnel oxide (ETOX). A comparison of floating gate tunnel oxide, textured poly, and MNOS technologies is described by S. Lai et al., "Comparison and Trends in Today's Dominate $E^2$ Technologies," *Int'l Electron Devices Meeting Tech. Digest,* (1986) pp. 580–583. ETOX fabrication principles are also well known and described by K. Robinson, "Endurance Brightens the Future of Flash—Memory as a Viable Mask-Storage Alternative," *Electronic Component News,* (November 1988) pp. 167–169.

Figure 2:
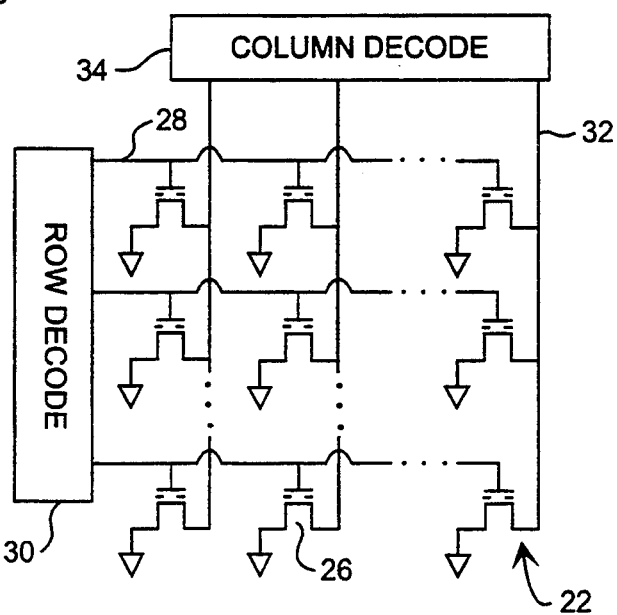
FIG. 2 is a schematic drawing of a portion of a programmable memory array according to the present invention.

Regardless of whether EPROM devices are formed according to floating tunnel oxide, textured poly, MNOS, or ETOX technology, there are numerous lithography steps needed to produce floating gate, control gate, tunneling area, etc., within a dense array of programmable transistors. As shown in FIG. 2, programmable transistors 26 within array 22 are controlled from the word lines 28 coupled to row decode 30. Information stored within each transistor can be read from or written to via bit lines 32, each bit line is coupled to column decode 34.

Figure 3:
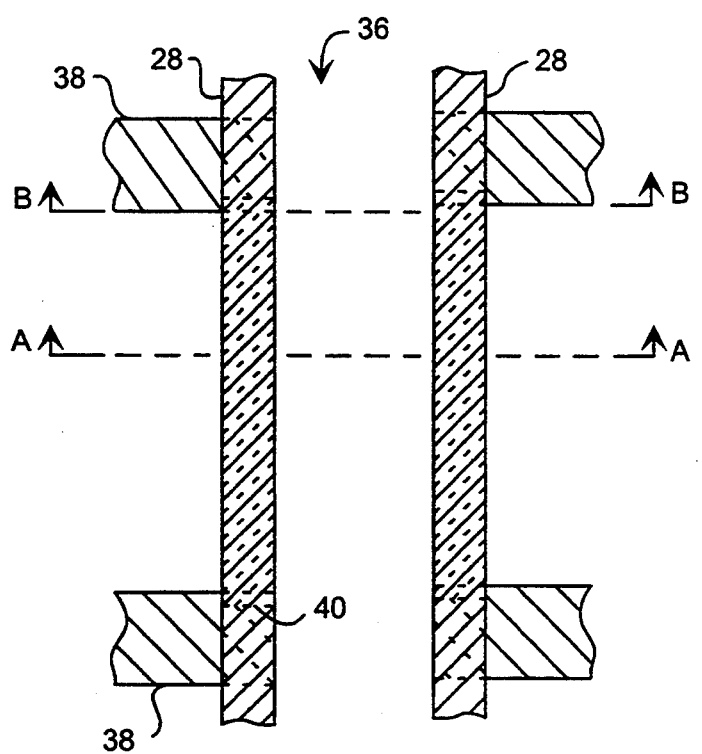
FIG. 3 is a top plan view of a portion of a programmable memory array core area formed according to the present invention.
Figure 4:
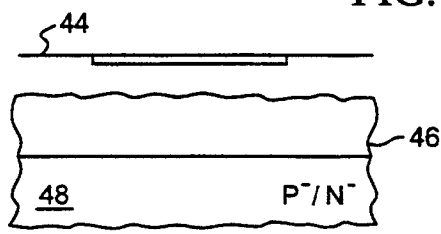
FIGS. 4–12 are a cross-sectional views along plane A—A of FIG. 3 during various processing steps according to the present invention.

Word lines 28 and bit lines 32 are formed close to one another, and little tolerance to misalignment is allowed. In a effort to overcome any misalignment of bird-beak encroachment problems often associated with field oxide misalignment with overlying polysilicon, recent advances have lead to self-alignment of source regions as described in U.S. Pat. No. 5,101,250 to Arima et al. (herein incorporated by reference) and U.S. Pat. No. 5,120,671 to Tang et al. (herein incorporated by reference). Self-aligned source technique described in Tang et al. allows formation of a single contiguous source between two rows of transistors. The contiguous source is easily formed using the word line edge as a masking edge. Field oxides which run perpendicular to the polysilicon word lines 28 can be etched and removed in order to form the contiguous power-coupled source area. Referring to FIG. 3, a contiguous source region 36 is shown between a pair of polysilicon word lines 28. Field oxide regions 38 terminate at the inside edge of polysilicon 28 by removing the field oxide in the source area using the self-aligned source technique. A channel region exists between field oxides 38 and below word line 28. In an EPROM embodiment, a floating gate 40 is placed between the channel and overlying word line 28.

For floating gate tunnel oxide processes, programming (moving electrons into the floating gate) is achieved by biasing the control gate or word line 28, while erasure (moving electrons out of the floating gate is achieved by biasing the drain. Electron transfer is achieved through a thin tunnel oxide separating the drain from the floating gate. The tunnel oxide generally exists only in a small area overlying the drain and adjacent a thicker gate oxide. Accordingly, in floating gate tunnel oxide technology, it is important that the drain extend a spaced distance below the floating gate and into the channel region in order to allow program and erase of the device.

As shown in prior art designs of FIGS. 14 and 15, lateral implant of the drain within the channel region can be accomplished by LAI techniques. By implanting the drain-side diffusion with an opposite dopant than that of the source and drain, short-channel effects can be minimized as described above. For reasons described above, the advantages of drain-side implant for EEPROM or EPROM devices is apparent. However, it is also apparent that drain-side implant, or source-side implant, or drain and source-side implant can be achieved as described below for non-programmable devices (or standard MOS FETs).

Figure 5:
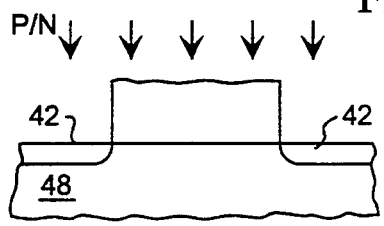

Turning now to FIGS. 4–12, various processing steps are shown in order to form a drain-side channel implant according to the present invention. The processing steps are merely exemplary and, for the sake of brevity, only a few of possibly many processing steps are shown. Numerous modifications and interim steps may be employed to produce the equivalent result, as would be known to a person skilled in the art. Beginning with FIG. 4, a drain implant mask 44 is used to form drain window openings within photoresist 46 placed upon the upper surface of substrate 48. Once photoresist is properly patterned according to drain mask 44, P-type impurities can be placed at a substantially perpendicular angle ($\pm 7°$ from perpendicular) into the P-type substrate or, alternatively, N-type impurities can be placed at a substantially perpendicular angle ($\pm 7°$ from perpendicular) into the N-type substrate. Suitable P-type impurities include $B^+$ or $BF_2^+$, whereas suitable N-type impurities include $P^+$. Implant dosages for boron or boron diflouride are generally within the range of $0.5 \times 10^{12} - 2.0 \times 10^{13}$ atoms/cm$^2$ at an implant energy at approximately 46 keV. Implant energies for phosphorous are within the range of approximately $1.0 \times 10^{12} - 2.0 \times 10^{13}$ atoms/cm$^2$ and at an implant energy of approximately 50 keV. Implant into drain regions 42, as shown in FIG. 5, provides a lightly doped region of the same type as the substrate necessary to improve the performance of the device in a method similar to LAI techniques.

Figure 6:
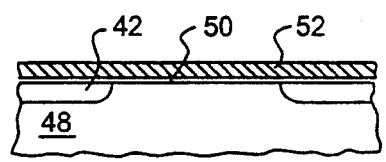

As shown in FIG. 6, after lightly doped drain regions 42 are formed, gate oxide 50 is grown over substrate 48, and a polysilicon layer 52 is deposited over gate oxide 50. As described above, gate oxide 50 can be configured according to ETOX technology or, alternatively, be of dissimilar thickness having a thinner tunnel oxide near the drain regions as in tunnel oxide technology. After the polysilicon is placed, polysilicon etch mask 54 is drawn above polysilicon 52 in order to etch the poly and leave patterns in polysilicon 52 upon substrate 48.

Figure 9:
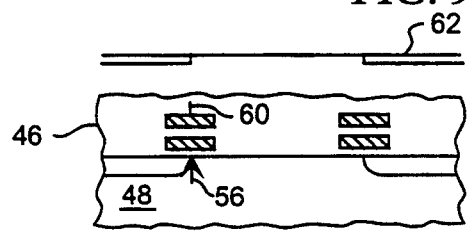

Patterned polysilicon 55 can comprise either the gate of a standard MOS transistor or the floating gate of an EPROM or EEPROM device. If an EPROM or EEPROM device is to be formed, a second polysilicon area, or word line 28 is patterned directly above floating gate 40, as shown in FIGS. 3 and 9. Floating gate 40 extends only above the channel area and overlaps slightly into the field oxide regions 38, whereas control gate 28 extends across the entire array and forms a word line.

It is important to note that drain mask 44 and polysilicon mask 54 are closely aligned with one another in order to form a patterned polysilicon 55 which overlies a demarcation line 56. Demarcation line is defined herein as a lateral separation point between a substantial majority of impurities (e.g., 90%) implanted into drain 42 and the impurities already present within substrate 48. The patterned polysilicon strip 55 comprises a width W defined between a pair of elongated edges 58A and 58B, a shown in FIG. 8. An alignment line 60 extends along the length of polysilicon strip 55 parallel to edges 58A and 58B. Alignment line 60 is in alignment with demarcation line 56 and also in direct perpendicular distance above the demarcation line. As is readily understood, polysilicon strip 55 extends parallel to demarcation line 56 for only a select portion or length of line 56. Thus, in drain boundary regions adjacent a channel area, polysilicon strip 55 comprises an alignment line 60 which is in alignment with select portions of the demarcation line 56 (or select portions of drain 42 boundary within the channel area). Accordingly, care must be taken to ensure polysilicon strip 55 is placed in a "overlapping" configuration above the channel area into which drain-side implant occurs. Alignment line 60 is preferably chosen near the center of polysilicon 55 and equidistant between edges 58A and 58B. However, slight deviations from center of mid-line can occur provided there remains overlap between polysilicon 55 and drain-side implant 42. For example, on a device having 0.5 critical dimensions (width of polysilicon 55) demarcation line 56 can extend 0.25 microns from the outer edge 58A toward the inner edge 58B.

Figure 10:
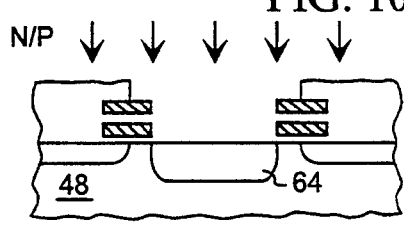
Figure 11:
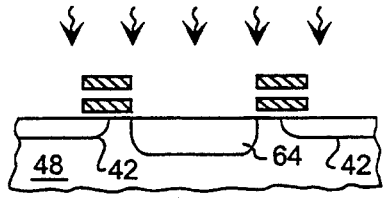
Figure 7:
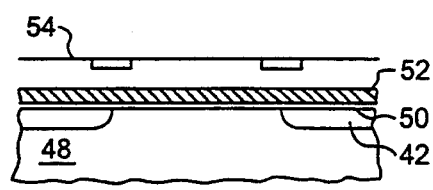
Figure 12:
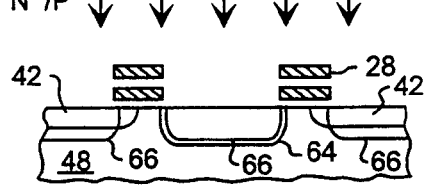
Figure 8:
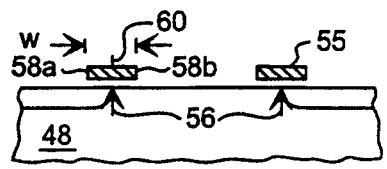

Referring now to FIGS. 9–11, a source implant mask 62 is used to pattern photoresist 46 in order to implant a source region 64, as shown in FIG. 10. Source region 64, contrary to drain implant 42, is doped opposite polarity than that of substrate 48. A low implant dosage is used for implanting source region 64. In particular, implant dosages must not exceed $2.5 \times 10^{14}$ atoms/cm$^2$ of phosphorous within an N-type substrate. Conversely, implant dosages of boron within a P-type substrate must not exceed $5.0 \times 10^{14}$ atoms/cm$^2$. Light doping concentration of phosphorous or boron within the etched self-aligned source region is used to improve junction breakdown of subsequently implanted, heavily doped, source regions. The phosphorous and boron implant in the self-aligned regions appears at a concentration peak density within substrate 48 of approximately 0.1 microns. True source and drain regions are subsequently implanted, as shown in FIG. 12, to form higher conductivity regions. Arsenic atoms can render the pre-disposed phosphorous atoms within the source region more conductive than that achieved by phosphorous double diffusion implant alone. Arsenic atoms for source conductivity are shown by reference numeral 66, for an exemplary P-type substrate. Boron or boron diflouride atoms can be used for an exemplary N-type substrate. Generally speaking, a thermal cycle occurs prior to source and drain implants 66. As shown in FIG. 11, the thermal cycle is used to allow source and drain tunnel regions, if, for example, ETOX technology is used having a tunnel oxide extending between the entirety of floating gate 40 and the upper surface of substrate 48 where it is recognized that thermal cycle or drive-in step shown in FIG. 11, is not necessary in many EPROM fabrication processes, and thereby, can be omitted.

Figure 13:
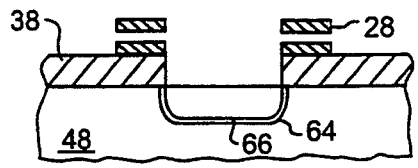
FIG. 13 is a cross-sectional view along plane B—B of FIG. 3 according to the present invention.

FIG. 12 illustrates implant with source and drain regions in order to form conductivity areas for overlying metalization (i.e., bit line contact to drain 42/66 and Vss contact to source 64/66). FIG. 12 is cross-section taken along plane A—A of FIG. 3 in order to show a latter stage of development for an EPROM area comprising an adjacent pair of EPROM cells with shared source 36 formed by implant regions 64 and 66. FIG. 13 illustrates a cross-sectional view along plane B—B of FIG. 3. Field oxide 38 is used to isolate adjacent cells from one another in order to read out and write to isolated bit areas. Therefore, drain 42 is isolated from drains of adjacent cells, however, source area 36 remains contiguous.

It is understood that the drain-side implant into the channel region can be accomplished for programmable transistors, as shown in FIG. 12, and it is also understood that drain-side implant can be achieved for standard MOS transistors (non-memory type transistors), as shown in FIG. 16. Similar to the process flow set forth in FIGS. 4–8, standard MOS transistor can be formed having a lateral diffusion boundary or demarcation line 56 extending into the channel region underlying polysilicon strip 55. It is also understood that by reversing drain mask 44 with source mask 62, and by implanting the source-side before the drain, source-side implant into the channel can be achieved. Accordingly, either drain-side implant or source-side implant, or both, can be utilized within a standard MOS device. However, if EPROM or EEPROM devices are formed, drain-side implant is the preferred methodology for reasons stated above. While MOS devices are not so limited, drain-side implant is still preferred.

Referring now to FIG. 17, it is understood that core memory area 22 as well as control logic area 24 receives a threshold implant within the channel region prior to topography formation. Threshold implant for core memory area 22 is accomplished by covering control logic area 24 with resist to block the implant. Likewise, area 22 is covered when area 24 is implanted. That is, core mask 72 opens the core area 22, but blocks the control area 24. Control mask 74 opens the control area 24, but blocks the core area 22. It is also understood that drain implant mask 44 within memory array 22 allows drain-side implant therein. Likewise, drain or source implant mask 68 can be formed within control area 24 in order to selectively place implant in either area of a standard MOS transistor.

It can be appreciated from the drawing of FIG. 17, that source implant mask 62 can be easily and readily formed by inverting (taking the negative exposure of) drain implant mask 44 as well as source/drain implant mask 68, and oring those masks with core mask 72 and control mask 74, respectively. The resulting mask, or source mask 62, is shown in cross-hatch in FIG. 18. Source mask 62 is well suited for implanting the Vss contiguous regions within the core or array area 52 as well as the source (or drain) regions within control logic 24. Thus, source mask 62 is readily formed from drain mask 44 and easily incorporated into the processing steps shown in FIGS. 9–10. Conversely, the drain mask 44 can be readily formed from the standard source mask 62 in order to achieve the advantages of the present invention set forth in the process flow described by FIGS. 4–8. Specifically, the negative of source mask 62 ored with core mask 72 will form drain mask 44 within only the core area.

It will be appreciated to those skilled in the art having the benefit of this disclosure that this invention is believed to be capable of applications with either EPROM or EEPROM memory devices as well as standard MOS (PMOS, NMOS, CMOS) technologies. EPROM or EEPROM memory devices are achieved having self-aligned source regions, and the drain mask is readily formed from the source mask used to achieve the self-aligned source regions. Furthermore, it is also to be understood, that the form of the invention shown and described is to be taken as a presently preferred embodiment. Various modifications and changes may be made to each and every processing step as would be obvious to a person skilled in the art without departing from the spirit and scope of the invention as set forth in the claims. It is intended that the following claims be interpreted to embrace all such modifications and changes and, accordingly, the specifications and drawings are to be regarded in an illustrative rather than a restrictive sense.

What is claimed is:

1. A method of manufacturing an MOS device comprising the steps of:
providing a substrate having a first type impurity placed therein;
drain-side implanting said first type impurity into drain regions within said substrate, wherein each drain region is laterally bounded by a demarcation line;
forming a polysilicon strip upon said substrate, wherein said strip extends substantially parallel with and above a select portion of said demarcation line; and source/drain implanting a second type impurity at a greater dose than said drain implanting step into source regions and into drain regions on opposite sides of said polysilicon strip.

2. The method as recited in claim 1, wherein said forming step comprises:

blanket depositing a layer of polysilicon across said substrate; and removing select portions of said polysilicon layer to form said polysilicon strip comprising a width defined between a pair of elongated edges, wherein an alignment line extends along said strip parallel to said edges such that said alignment line is in alignment with and in direct perpendicular distance above said select portion of the demarcation line.

3. The method as recited in claim 2, wherein said alignment line is midway between said edges.

4. The method as recited in claim 1, wherein said first type impurity is dissimilar from said second type impurity.

5. The method as recited in claim 1, wherein said drain implanting step comprises:

depositing photoresist upon said substrate;

placing a drain implant mask above said photoresist;

polymerizing said photoresist in accordance with a pattern upon said drain implant mask and removing non-polymerized photoresist; and ion bombarding select drain regions upon said substrate void of photoresist.

6. The method as recited in claim 5, wherein said ion bombarding step comprises directing ions of said first type impurity into said substrate at an angle substantially perpendicular to said substrate.

7. The method as recited in claim 1, wherein said source/drain implanting step comprises:

depositing photoresist upon said substrate;

placing a source implant mask above said photoresist;

polymerizing said photoresist in accordance with a pattern upon said source implant mask and removing non-polymerized photoresist;

ion bombarding select source regions upon said substrate void of photoresist; and removing the remaining photoresist and ion bombarding a plurality of active regions upon said substrate.

8. The method as recited in claim 7, wherein said ion bombarding step comprises directing ions of said second type impurity into said substrate at an angle substantially perpendicular to said substrate.

9. The method as recited in claim 7, wherein said active regions comprise source and drain regions.

10. The method as recited in claims 5 or 7, wherein said drain implant mask is a negative of said source implant mask at select portions of said drain implant mask.

11. The method as recited in claim 1, further comprising the step of placing another polysilicon strip a spaced distance above said polysilicon strip prior to said source/drain implanting step in order to form an electrically programmable transistor.

12. The method as recited in claim 1, wherein said polysilicon strip is formed through a self-aligned poly etch process with another polysilicon strip spaced a distance above said polysilicon strip in order to form an electrically programmable transistor.

13. The method as recited in claim 1, further comprising the step of contacting metalization to said drain regions, wherein said metalization comprises a bit line within an array of memory cells.

14. A method of manufacturing an MOS device comprising the steps of:

providing a substrate having a first type impurity placed therein;

depositing a photoresist upon said substrate and placing a drain implant mask above said photoresist;

polymerizing said photoresist in accordance with a pattern upon said drain implant mask and removing non-polymerized photoresist;

ion bombarding select drain regions upon said substrate void of photoresist, wherein each drain region is laterally bounded by a demarcation line;

forming a polysilicon strip comprising a width defined between a pair of elongated edges, wherein a alignment line extends along said strip parallel to said edges such that said alignment line is in alignment with and in direct perpendicular distance above a select portion of said demarcation line;

depositing a photoresist upon said substrate and placing a source implant mask above said photoresist, said drain implant mask is a negative of said source implant mask at select portions of said drain implant mask;

polymerizing said photoresist in accordance with a pattern upon said source implant mask and removing non-polymerized photoresist;

ion bombarding select source regions upon said substrate void of photoresist; and removing the remaining photoresist and ion bombarding a plurality of source/drain regions upon said substrate at a higher dose and of opposite impurity type than said drain implant step into source regions and into drain regions on opposite sides of said polysilicon strip.

15. The method as recited in claim 14, wherein said alignment line is midway between said edges.

16. The method as recited in claim 14, wherein said source/drain regions are bounded by a field oxide region.

17. The method as recited in claim 14, further comprising the step of placing another polysilicon strip a spaced distance directly above said polysilicon strip prior to the step of ion bombarding select source regions in order to form an electrically programmable transistor.

18. The method as recited in claim 14, wherein said polysilicon strip is formed through a self-aligned poly etch process with another polysilicon strip spaced a distance above said polysilicon strip in order to form an electrically programmable transistor.

19. The method as recited in claim 14, wherein each of said ion bombarding steps comprise directing ions of said second type impurity into said substrate at an angle substantially perpendicular to said substrate.

20. The method as recited in claim 14, further comprising the step of contacting metalization to said drain regions, wherein said metalization comprises a bit line within an array of memory cells.

* * * * *